US011592881B2

(12) United States Patent
Yang et al.

(10) Patent No.: US 11,592,881 B2
(45) Date of Patent: Feb. 28, 2023

(54) TOOL-LESS APPARATUS AND METHODS FOR SEALING THE FLOW OF COOLING FAN AIR TO A HEAT EXCHANGER

(71) Applicant: DELL PRODUCTS L.P., Round Rock, TX (US)

(72) Inventors: Ching-Hsiang Yang, Taichung (TW); Yi-Chang Yeh, Taipei (TW); Yu-Ming Kuo, New Taipei (TW); Yan-Zih Chen, Taipei (TW)

(73) Assignee: Dell Products L.P., Round Rock, TX (US)

( * ) Notice: Subject to any disclaimer, the term of this patent is extended or adjusted under 35 U.S.C. 154(b) by 293 days.

(21) Appl. No.: 16/860,453

(22) Filed: Apr. 28, 2020

(65) Prior Publication Data
US 2021/0333847 A1    Oct. 28, 2021

(51) Int. Cl.
*G06F 1/20* (2006.01)
*F28F 9/26* (2006.01)
*H05K 7/20* (2006.01)

(52) U.S. Cl.
CPC .............. *G06F 1/20* (2013.01); *F28F 9/26* (2013.01); *H05K 7/20145* (2013.01); *H05K 7/20154* (2013.01); *H05K 7/20172* (2013.01); *F28F 2230/00* (2013.01); *F28F 2280/04* (2013.01); *G06F 1/203* (2013.01); *G06F 2200/201* (2013.01)

(58) Field of Classification Search
CPC ...... F28F 9/26; F28F 2230/00; F28F 2280/04; F28F 2280/10; F28F 2280/105; G06F 1/203; H05K 7/20145; H05K 7/20154; H05K 7/20172
See application file for complete search history.

(56) References Cited

U.S. PATENT DOCUMENTS

| | | | | |
|---|---|---|---|---|
| 6,031,719 | A * | 2/2000 | Schmitt | H05K 7/20172 361/679.48 |
| 6,302,189 | B1 * | 10/2001 | Lin | H05K 7/20172 165/80.3 |
| 6,352,103 | B1 * | 3/2002 | Chu | G06F 1/203 174/16.3 |
| 9,845,805 | B2 | 12/2017 | Bhutani et al. | |
| 10,372,575 | B1 | 8/2019 | North et al. | |
| 10,788,847 | B2 | 9/2020 | North et al. | |

(Continued)

*Primary Examiner* — Eric S Ruppert
*Assistant Examiner* — Hans R Weiland
(74) *Attorney, Agent, or Firm* — Egan, Enders & Huston LLP.

(57) ABSTRACT

Tool-less apparatus and methods are provided for sealing flow of cooling air from the outlet of a cooling fan blower to the inlet of a heat exchanger within a chassis enclosure of an information handling system. The disclosed apparatus and methods may be implemented in a tool-less manner by employing tool-less chassis mounting features that mate with tool-less cooling fan mounting features to mechanically align and secure an air outlet of a cooling fan blower in sealing relationship with an air inlet of a heat exchanger within a chassis enclosure of an information handling system by properly aligning the axes of a cooling fan in relation to the inlet of the heat exchanger so that in on embodiment no gap exists between the cooling air outlet of the cooling fan and the cooing air inlet of the heat exchanger.

23 Claims, 11 Drawing Sheets

(56) References Cited

U.S. PATENT DOCUMENTS

| | | | |
|---|---|---|---|
| 2006/0279929 A1* | 12/2006 | Chen | H05K 7/20172 361/697 |
| 2007/0146991 A1* | 6/2007 | Chen | H05K 7/20172 165/122 |
| 2007/0171612 A1* | 7/2007 | Chen | H05K 7/20172 361/695 |
| 2008/0144281 A1* | 6/2008 | Chen | H05K 7/20172 361/695 |
| 2009/0147477 A1* | 6/2009 | Chao | G06F 1/203 361/697 |
| 2010/0107397 A1* | 5/2010 | Letourneau | H05K 7/20172 29/466 |
| 2011/0134603 A1* | 6/2011 | Yeh | H05K 7/20145 361/679.47 |
| 2012/0125566 A1* | 5/2012 | Liu | G06F 1/20 165/67 |
| 2015/0351280 A1* | 12/2015 | Gonzalez Inda | H05K 7/20172 415/126 |

* cited by examiner

TOOL-LESS APPARATUS AND METHODS FOR SEALING THE FLOW OF COOLING FAN AIR TO A HEAT EXCHANGER

FIELD

This invention relates generally to cooling fans and, more particularly, to mounting of cooling fan blowers within an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Cooling fan blowers play an important role in stability, performance and durability. of information handling systems such as notebook computers. A cooling fan blower is used to blow cooling air through thermally-conductive cooling fins of a heat exchanger (e.g., such as a central processing unit) that are thermally coupled by a heat pipe to heat-generating component/s within a metal or plastic chassis enclosure of the information handling system. Heat is transferred by the heat pipe from the heat-generating component/s across the heat exchanger cooling fins, where the cooling air from the cooling fan blower draws out the heat from the cooling fins before it is exhausted from the chassis enclosure to the ambient environment outside of the chassis enclosure.

Existing conventional methods for mounting a cooling fan blower within a chassis enclosure of an information handling system are tooled methods that utilize multiple screws for affixing the cooling fan blower to a surface within the chassis enclosure in a fixed position with its outlet aligned with an inlet of the cooling fins of a heat exchanger. When so affixed with the screws, the cooling fan blower outlet blows some air through the cooling fins. However, a gap exists between the screw-affixed cooling fan blower air outlet and the inlet of the cooling fins due to mechanical tolerance limitations and allowance required for room to position the cooling fan blower next to the inlet of the cooling fins for attachment by the screws.

A proportion of the cooling air provided by the cooling fan blower is lost through this gap instead of passing through the cooling fin inlet to contact the cooling fins, i.e., the lost cooling air is instead recirculated within the chassis enclosure of the information handling system. The result of this air recirculation is that hot air is not effectively exhausted outside the chassis enclosure of the information handling system to the outside environment, but instead accumulates as waste heat within the system chassis enclosure. This accumulated waste heat within the chassis enclosure causes pre-heated air to be drawn in and provided by the cooling fan blower to the cooling fin inlet, which in turn causes increased heat exchanger inlet temperature. In addition to waste heat buildup within a system chassis enclosure, loss of cooling air through the gap between the cooling fan blower outlet and the thermal cooling fan inlet means that less airflow flux passes through the heat exchanger cooling fins, resulting in reduced air flow velocity through the cooling fins. Lower air flow velocity through the cooling fins causes reduced turbulent flow and internal forced convection within the heat exchanger, which in turn reduces the heat transfer coefficient of the heat exchanger.

Recirculating heated air to the cooling fins and reduced heat exchanger heat transfer coefficient are major factors that lower the thermal handling capability of an information handling system. Lower thermal handling capability not only leads to undesirably high CPU temperatures but also to increased temperature of other components of the information handling system. In an attempt to enhance the system thermal handling capability, a separate sponge or Mylar material is commonly applied to try to seal the gap between the cooling fan blower outlet and the inlet of the cooling fins. Applying such a separate material is not always effective and also adds expense to the cost of the information handling system.

SUMMARY

Disclosed herein are tool-less apparatus and methods for sealing flow of cooling air from the outlet of a cooling fan blower to the inlet of a heat exchanger within a chassis enclosure of an information handling system. The disclosed apparatus and methods may be implemented in a tool-less manner by employing tool-less chassis mounting features that mate with tool-less cooling fan mounting features to mechanically align and secure an air outlet of a cooling fan blower in sealing relationship with an air inlet of a heat exchanger within a chassis enclosure of an information handling system by properly aligning the three axes (i.e., X, Y and Z axes) of a cooling fan in relation to the inlet of the heat exchanger so that in on embodiment no gap exists between the cooling air outlet of the cooling fan and the cooing air inlet of the heat exchanger. In such an embodiment, no gap exists between the installed cooling fan blower air outlet and the heat exchanger air inlet so that flow of cooling air from the cooling fan blower outlet to the heat exchanger inlet may be sealed without the cost and presence of additional sealing materials (e.g., such as sponge or Mylar), and therefore a greater proportion of the cooling air expelled by the cooling fan blower may be provided to the heat exchanger inlet than is possible with conventional tooled cooling fan blower assemblies that have no separate sealing materials. This results in decreased heat exchanger temperatures and increased heat transfer coefficient, as well as reducing or eliminating heat accumulation within the system chassis enclosure, all of which results in improved cooling of system heat-generating components as compared to conventional cooling fan blower configurations.

In one embodiment, the disclosed apparatus and methods may be implemented to eliminate any gap and achieve an air seal between cooling fan blower outlet and heat exchanger inlet within a chassis enclosure of an information handling system so as to increase cooling fin air flow and heat transfer coefficient as compared to conventional tooled cooling fan blower components that are employed for conventional information handling systems. This results in higher thermal performance and increased thermal handling capability for the disclosed apparatus and methods than is possible with such conventional tooled cooling fan blower configurations. The increased thermal handling capacity of the disclosed apparatus and methods allows heat-generating system components (e.g., such as a central processing unit "CPU") to operate at acceptable temperatures (e.g., the same or lower operating temperatures) at the same performance level with the cooling fan blower running at a lower fan speed than would otherwise be required for a conventional cooling fan blower configuration. Moreover, in on embodiment the tool-less installation and removal mechanism of the disclosed cooling fan blower apparatus also provides a quicker and more convenient way for the end user or service technician to easily replace the cooling fan blower, or to remove the cooling fan blower to access other component/s under the cooling fan blower, as compared to a conventional tooled cooling fan blower that is affixed to the chassis enclosure using mechanical fasteners such as screws.

In one respect, disclosed herein is an information handling system including: a heat exchanger defining an air inlet having a cross-sectional air flow area; at least two rails disposed adjacent opposite sides of the air inlet of the heat exchanger, each of the rails defining a rail opening therein; a resilient retainer positioned in fixed spaced relationship opposite to the air inlet of the heat exchanger; at least one post positioned in fix spaced relationship to the air inlet of the heat exchanger; and a cooling fan blower received in mating relationship with the heat exchanger, the cooling fan blower including a cooling fan blower housing defining an air outlet on a proximal end of the cooling fan blower housing, the air outlet being dimensioned with a cross-sectional air flow area that is complementary in shape and size to the cross-sectional air flow area of the air inlet of the heat exchanger, and the air outlet of the cooling fan blower being aligned and sealingly mated with the air inlet of the heat exchanger to form an airflow path between the cooling fan blower and the heat exchanger. The cooling fan blower may further include: two outward extending pins disposed adjacent opposite sides of the air outlet on the proximal end of the cooling fan blower, each of the pins being received within the respective rail opening defined within one of the rails with the air outlet of the cooling fan blower aligned and sealingly mated with the air inlet of the heat exchanger, at least one post opening defined adjacent a periphery of the cooling fan blower, the post opening receiving the at least one post to align the position of the cooling fan blower air outlet relative to the heat exchanger with the air outlet of the cooling fan blower aligned and sealingly mated with the air inlet of the heat exchanger. The resilient retainer may mechanically contact the cooling fan blower housing with the air outlet of the cooling fan blower aligned and sealingly mated with the air inlet of the heat exchanger.

In another respect, disclosed herein is a system including an information handling system. The information handling system may include: a heat exchanger defining an air inlet having a cross-sectional air flow area; at least two rails disposed adjacent opposite sides of the air inlet of the heat exchanger, each of the rails defining a rail opening therein; a resilient retainer positioned in fixed spaced relationship opposite to the air inlet of the heat exchanger; and at least one post positioned in fixed relationship to the air inlet of the heat exchanger.

In another respect, disclosed herein is a method including positioning a cooling fan blower in mating relationship with a heat exchanger of an information handling system by aligning and sealingly mating an air outlet defined on a proximal end of a housing of the cooling fan blower with an air inlet of the heat exchanger to form an airflow path between the cooling fan blower and the heat exchanger. The method may further include the steps of: first positioning each of two outward extending pins of the cooling fan blower within a respective opening defined within one of two rails disposed adjacent opposite sides of the air inlet of the heat exchanger, the outward extending pins being disposed adjacent opposite sides of the air outlet on the proximal end of the cooling fan blower; then positioning at least one post opening defined adjacent a periphery of the cooling fan blower in aligned position over at least one post extending in fixed spaced relationship to the air inlet of the heat exchanger while positioning a distal end of the cooling fan blower over a resilient retainer that extends upward in fixed spaced relationship opposite to the air inlet of the heat exchanger; then pivoting the distal end of the cooling fan blower toward the resilient retainer to insert the at least one post into the at least one post opening to align the position of the cooling fan blower air outlet relative to the heat exchanger with the air outlet of the cooling fan blower aligned and sealingly mated with the air inlet of the heat exchanger; and deflecting the resilient retainer away from the heat exchanger air inlet while pivoting the distal end of the cooling fan blower to provide clearance for the distal end of the cooling fan blower to bring the distal end of the cooling fan blower adjacent the resilient retainer, and then allowing the resilient retainer to relax back toward the heat exchanger air inlet to mechanically contact and engage the cooling fan blower housing with the air outlet of the cooling fan blower aligned and sealingly mated with the air inlet of the heat exchanger.

DESCRIPTION OF ILLUSTRATIVE EMBODIMENTS

Figure 1:
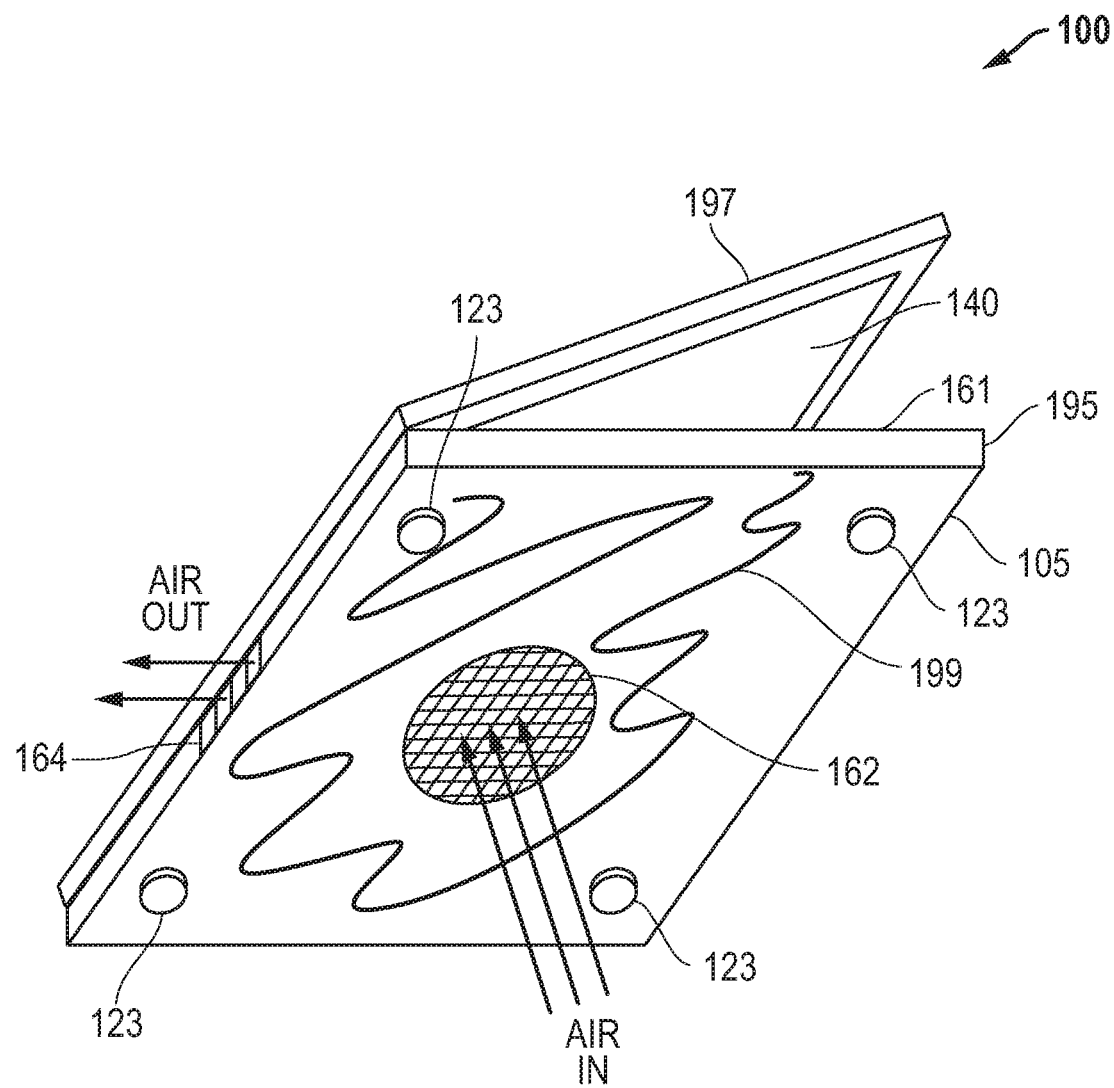
FIG. 1 illustrates an underside perspective view of an information handling system according to one exemplary embodiment of the disclosed systems and methods.

FIG. 1 illustrates a perspective view of one exemplary embodiment of an information handling system 100 having a chassis enclosure 105 that is configured as a two-piece hinged clamshell enclosure for a notebook computer 100. Although an exemplary notebook computer 100 is illustrated in FIG. 1, it will be understood that the disclosed systems and methods may be implemented for sealing flow of a cooling fan air to a heat exchanger within a chassis enclosure of other types of information handling systems, including other types of portable information handling systems such as tablet computers, etc.

As shown, chassis enclosure 105 includes a base component 195 that is hingeably coupled to a lid component 197 that includes integrated display 140. In one embodiment, base component 195 encloses other components of system 100, including heat-generating components such as a central processing unit (CPU), graphics processing unit (GPU), other programmable integrated circuits, power supply and power regulation circuitry, as well as a heat exchanger system 204 and cooling fan blower 202 that are described further herein. Although an exemplary notebook computer 100 is illustrated herein, it will be understood that the disclosed apparatus and methods may be implemented with other types of information handling systems (e.g., tablet computers, desktop or tower computers, all-in-one computers, etc.) for sealingly aligning a cooling fan blower air outlet with a heat exchanger cooling air inlet in a manner as described and illustrated further herein.

Also shown in FIG. 1 is a chassis cooling air inlet 162 defined in a downward-facing (bottom) external planar surface 199 of base component 105 (e.g., planar surface indicated in FIG. 1 by surface indicia), and chassis cooling air outlet 164 defined in a back side of base component 105, it being understood that number, positioning and configuration of cooling air inlets and outlets may vary in other embodiments. Feet (e.g., rubber spacer pads) 123 are provided as shown near four corners of bottom surface 199 for resting on the surface of a table or desk to provide airflow space between the bottom surface 199 and the table or desk top surface 199. Not shown in FIG. 1 are keys of an integrated keyboard that face outward from a top side 161 of base component 195 in a position for accepting typing input from a user when the bottom surface 199 of the chassis enclosure is placed on a user's lap or on a substantially horizontal surface such as a desk or table.

Figure 2:
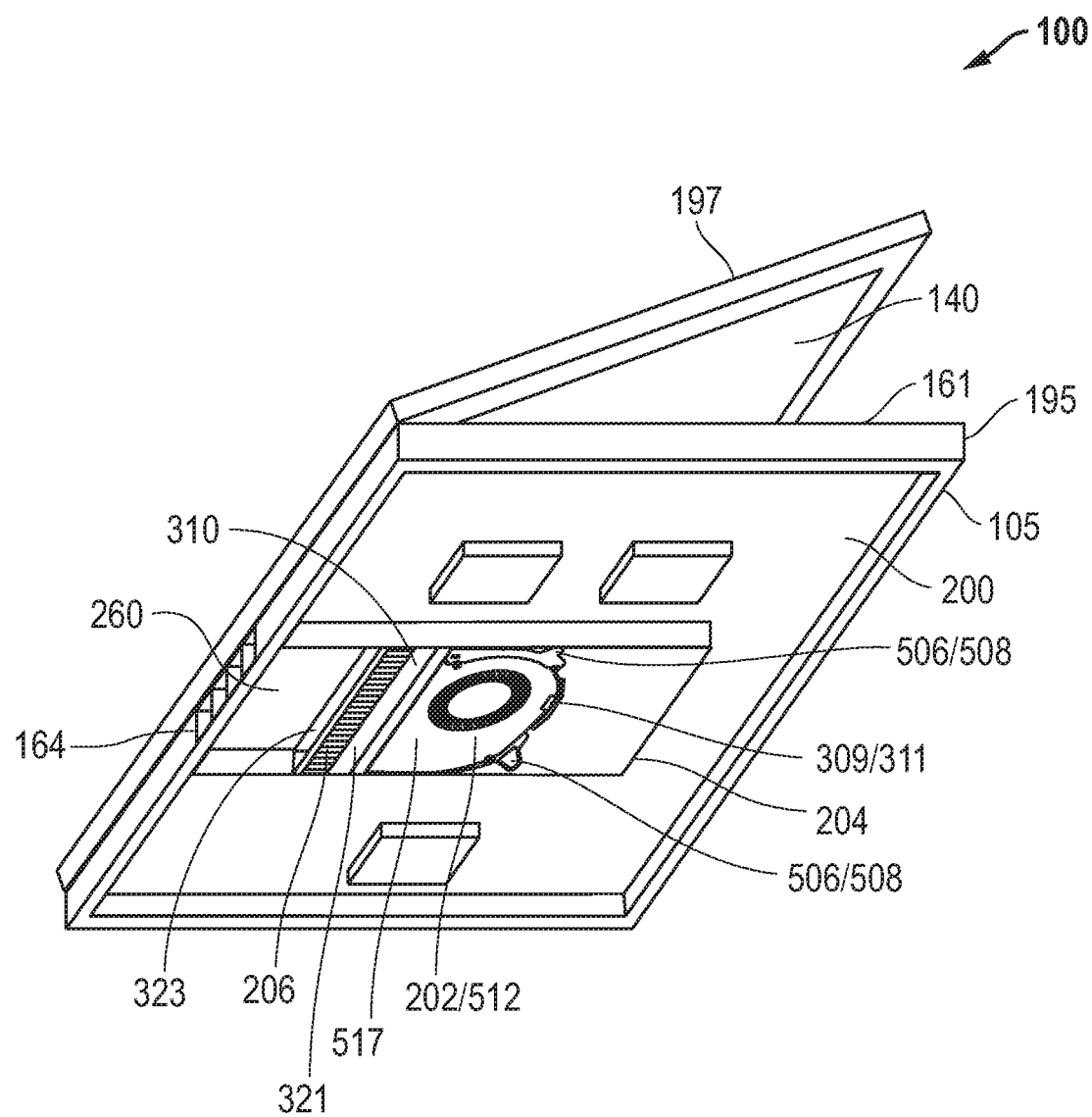
FIG. 2 illustrates an underside perspective view of the information handling system of FIG. 1 with its bottom surface removed according to one exemplary embodiment of the disclosed systems and methods.

FIG. 2 illustrates a perspective view of the underside of chassis enclosure 105 of FIG. 1, with the bottom surface 199 removed, e.g., such as in the case of a bottom surface that is provided as a removable bottom cover. With bottom surface removed, an internal cavity 200 is visible that is defined within base component 195 of chassis enclosure 105. As shown, internal cavity 200 contains a centrifugal cooling fan blower 202 that is mated and affixed to a heat exchanger module 204 that includes a heat exchanger 321 having thermal cooling fins 206, which may in turn be thermally coupled by a heat pipe to transfer heat to the cooling fins 206 from the above-listed heat generating components that are also contained within the internal cavity 200. As shown, heat exchanger module 204 is positioned so that heated air exiting the heat exchanger outlet 323 from cooling fins 206 is exhausted outside of chassis enclosure 105 via an internal air duct 260 through cooling air outlet 164 defined in a back side of base component 105. Configurations of heat exchangers, cooling fan blowers, and heat-generating components within an information handling system may be found described, for example, in U.S. Pat. Nos. 9,845,805; 10,372,575; and U.S. patent application Ser. No. 15/585,509, each of which is incorporated herein by reference in its entirety for all purposes.

Figure 3:
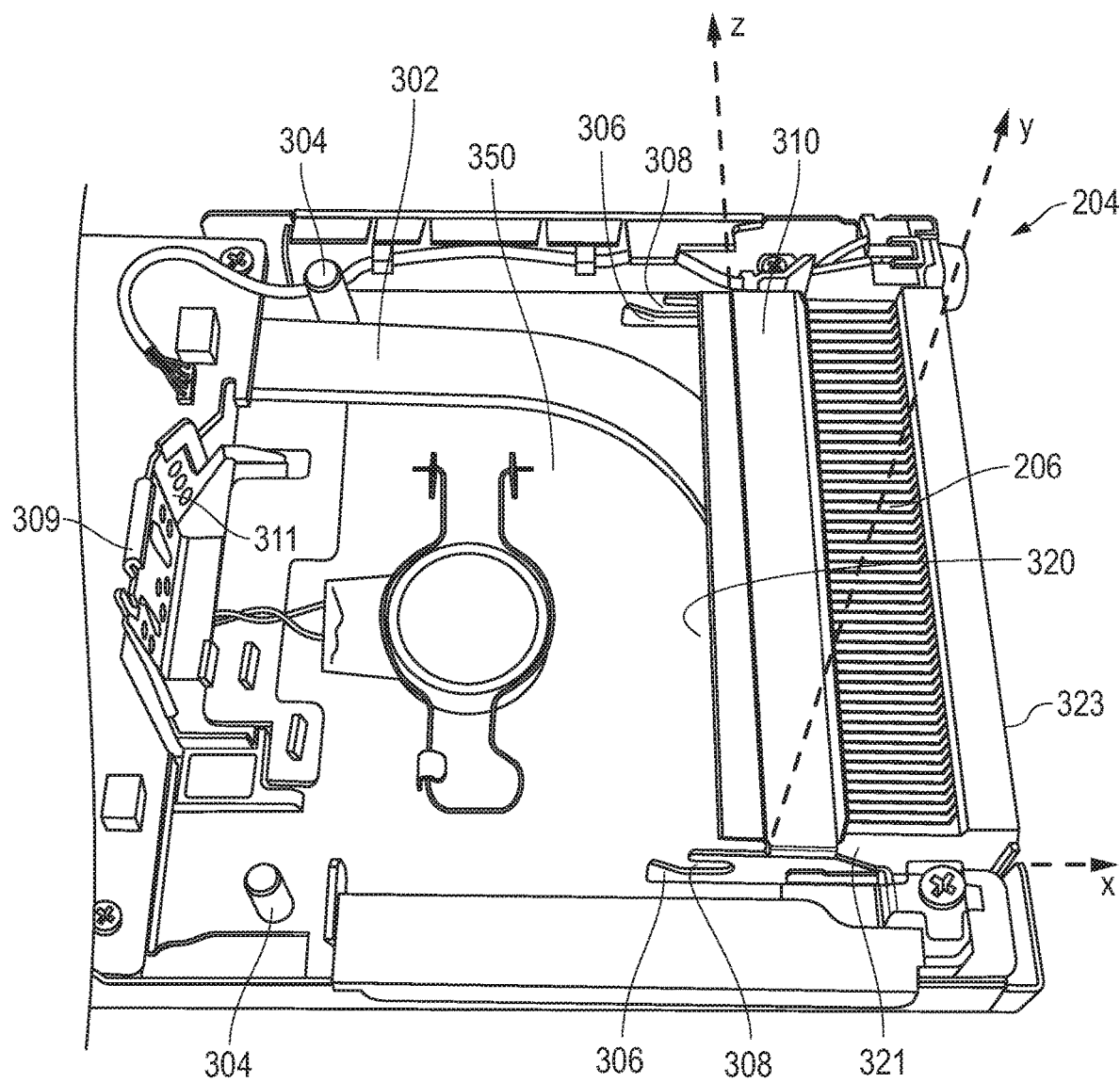
FIG. 3 illustrates a partial side overhead perspective view of a heat exchanger module according to one exemplary embodiment of the disclosed systems and methods.
Figure 4:
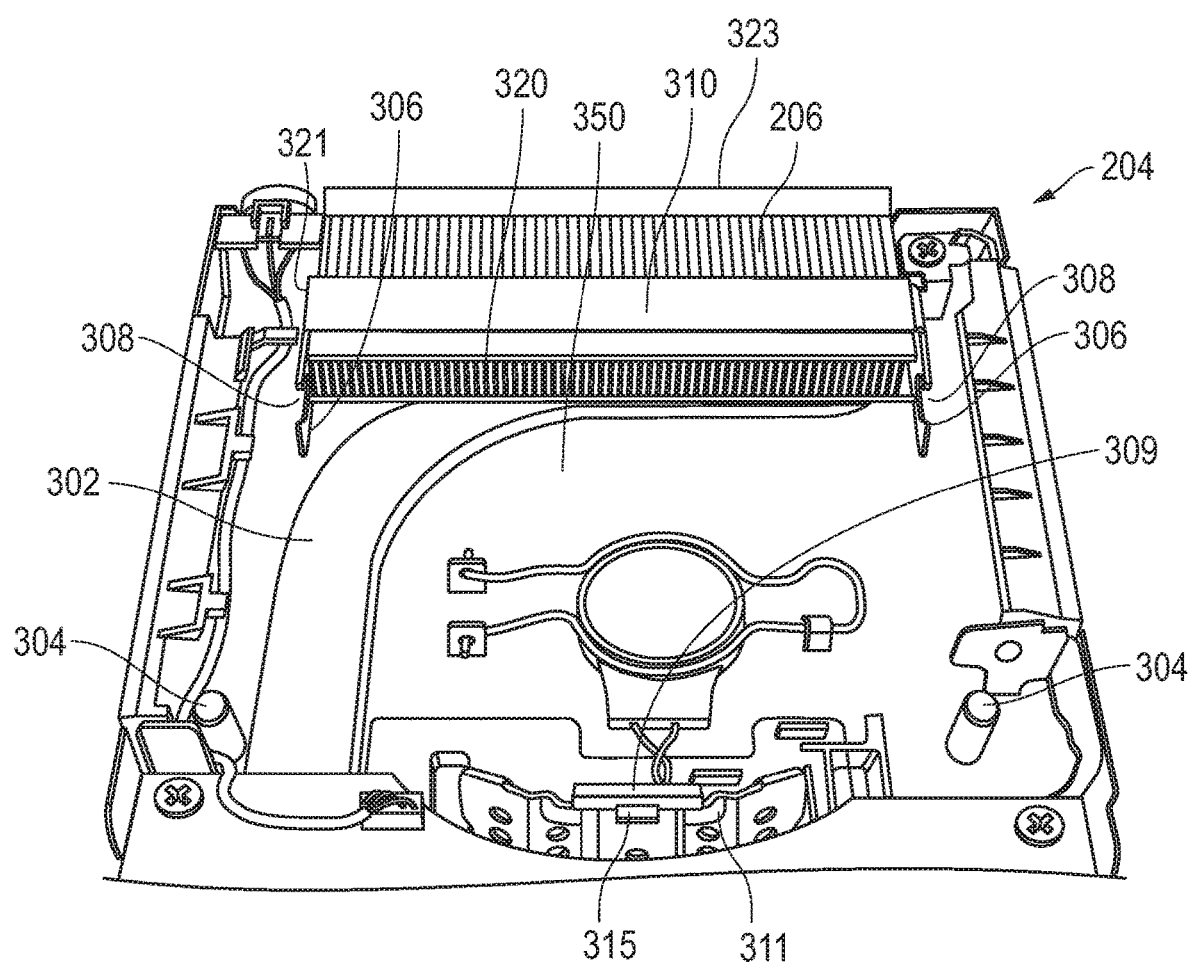
FIG. 4 illustrates a partial end perspective view of the heat exchanger module of FIG. 3 according to one exemplary embodiment of the disclosed systems and methods.

FIG. 3 illustrates a partial side overhead perspective view of a heat exchanger module 204 configured to receive a mating cooling fan blower 202 in a tool-less manner according to one exemplary embodiment of the disclosed apparatus and methods. FIG. 4 illustrates a partial end perspective view of the heat exchanger module 204 of FIG. 3. In one embodiment, heat exchanger module 204 may be provided as a planar metal and/or plastic fixture having a base plate 350 upon which heat exchanger components and tool-less chassis mounting features for a cooling fan blower 202 are mechanically coupled, and which is itself in turn mechanically coupled directly or through one or more other components to an outer wall of chassis enclosure 105. However, it is alternatively possible that the heat exchanger 321 and tool-less chassis mounting features described herein for heat exchanger module 204 may be mechanically coupled directly to (on integrally formed with) an outer wall of chassis enclosure 105 without an intervening base plate 350 and/or presence of a separate heat exchanger module.

As shown in FIGS. 3 and 4, heat exchanger module 204 includes a heat exchanger 321 that has cooling fins 206 (e.g., manufactured of aluminum, copper or other thermally conductive materials) that are thermally coupled to a heat pipe 302 that is configured to transfer heat from heat-generating component/s of the information handling system 100 (e.g., CPU, GPU, etc.) to the cooling fins 206. In the illustrated embodiment, the heat exchanger 321 of module 204 includes an air-sealing shell or shroud 310 that forms at least a portion of an enclosed cooling airflow path that directs incoming air received at an elongated air inlet 320 of the heat exchanger 321 to and across cooling fins 206 and out the air outlet 323 of the heat exchanger 321. In this embodiment, the elongated shape of air inlet 320 extends in a side-to-side manner (between its opposing sides) in a direction that is parallel to the Z-axis, with each of the X-axis, Y-axis and Z-axis being oriented perpendicular to each other.

In the illustrated embodiment, the heat exchanger air inlet 320 is configured to receive cooling air from cooling air outlet 502 of cooling fan blower 202 and is defined by one end of the enclosed cooling airflow path formed by air-sealing shell or shroud 310 that partially or completely surrounds a periphery of at least one end of cooling fins 206 as shown. Shell or shroud 310 may be formed of sheet metal, plastic, or other suitable material, and may form an air inlet 320 that is dimensioned to have a cross-sectional air flow area (e.g., defined by air inlet height and width) that is complementary in shape and size to the cross-sectional air flow area (e.g., defined by air outlet height and width) of cooling air outlet 502 for sealingly mating with cooling air outlet 502 of cooling fan blower housing 512 with no gap therebetween, e.g., such that no cooling airflow leakage occurs between mated cooling air outlet 502 and cooling air inlet 320 during operation of cooling fan blower 202.

Also illustrated in the embodiment of FIGS. 3 and 4 are tool-less chassis mounting features that are mechanically coupled to, or mechanically integrated with, the heat exchanger module 204. These tool-less chassis mounting features are configured to mechanically align and mate with corresponding tool-less cooling fan mounting features to secure cooling fan blower 202 to a heat exchanger module 204 with its cooling air outlet 502 aligned in a fixed sealed position with the heat exchanger air inlet 320, i.e., so that no gap exists between the cooling air outlet 502 of the cooling fan blower 202 and the heat exchanger cooling air inlet 320. The tool-less chassis mounting features of this embodiment may include two rigid alignment posts 304 (e.g., plastic or metal posts) that extend outward (e.g., upward in FIGS. 3 and 4) from a surface of a base plate 350 of heat exchanger module 204 in a direction that is parallel to the Y-axis, two sliding rails 306 (with respective pin openings 308) that are disposed adjacent opposite ends of the elongated opening of heat exchanger cooling air inlet 320, and a flexible and resilient convex retainer 311 (e.g., flexible sheet metal or plastic) extending upward in cantilevered manner from base plate 350 at a position that is spaced apart from the heat exchanger cooling air inlet 320 by a distance configured to securely receive cooling fan blower 202 therebetween.

As shown in FIG. 4, a retainer opening 315 may be defined within a body of flexible and resilient convex retainer 311 as shown in FIG. 4, and may be configured to receive mechanically engage a mating retainer tab 297 (e.g., a plastic or metal tab shaped complimentary to be received within retainer opening 315) of cooling fan blower housing 512 when mated to the heat exchanger module 204. Also shown is an inwardly protruding lip or hook 309 that may be provided on a distal end of retainer 311 (opposite to its proximal end at base plate 350) for engaging an upper surface of cooling fan blower housing 512 when it is fully received in mated relationship with heat exchanger module 204. Although one embodiment of a resilient retainer 311 having a protruding lip or hook 309 and retainer opening 315 are illustrated herein, it will be understood that other configurations of a resilient retainer may be provided, including non-convex embodiments and/or embodiments without a protruding lip or hook 309 and/or without a retainer opening 315 (e.g., for mating with a fan blower housing having no retainer tab 297). For example, in one embodiment where a resilient retainer 311 is provided with no protruding lip or hook 309 or retainer opening 315, a resilient retainer 311 may rely on mechanical contact alone to contact and align a cooling fan blower housing 512 in the Y-axis with a heat exchanger cooling air inlet 320 of a heat exchanger module 204.

Figure 5:
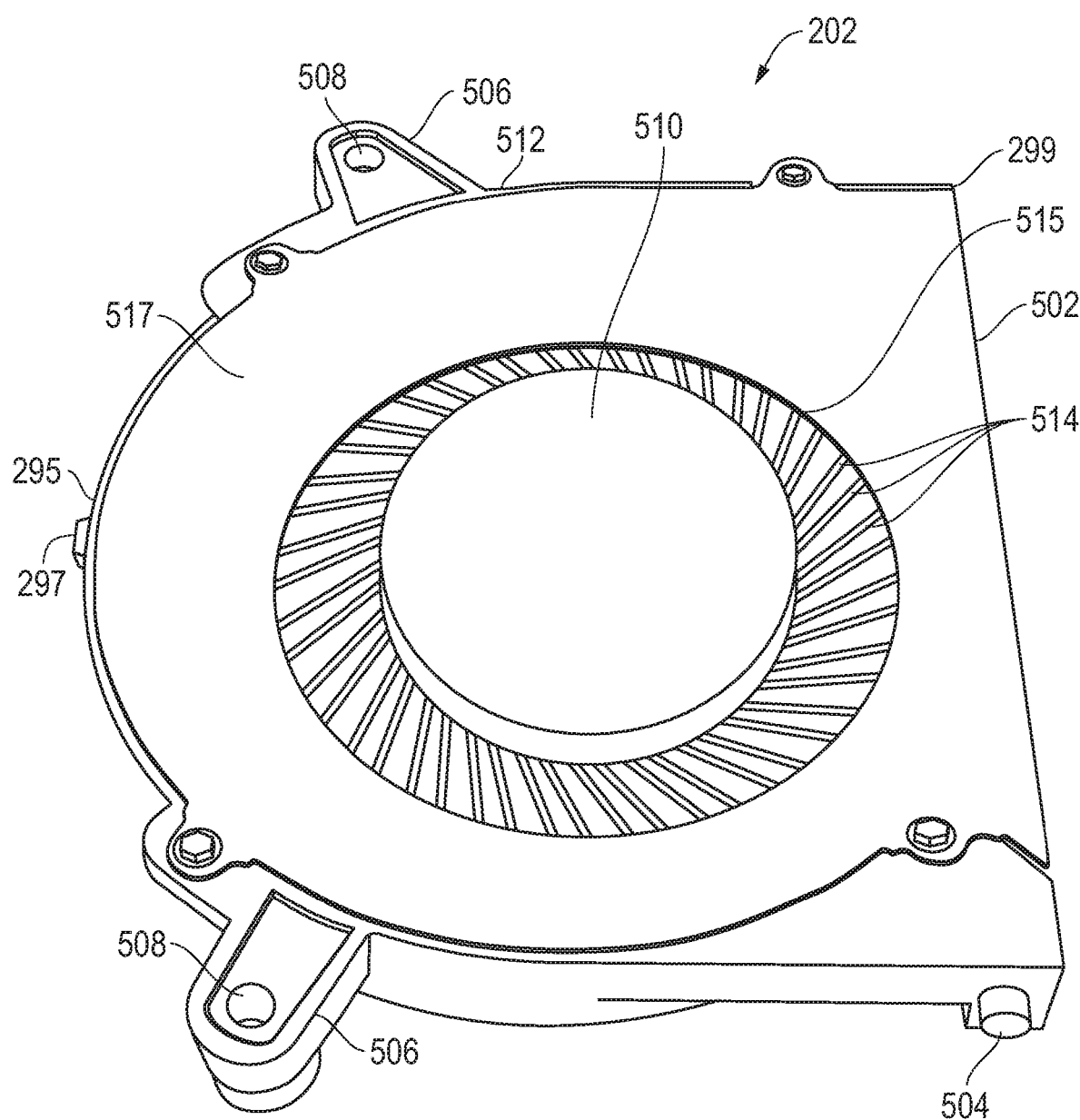
FIG. 5 illustrates an overhead side perspective view of a cooling fan blower according to one exemplary embodiment of the disclosed systems and methods.
Figure 6:
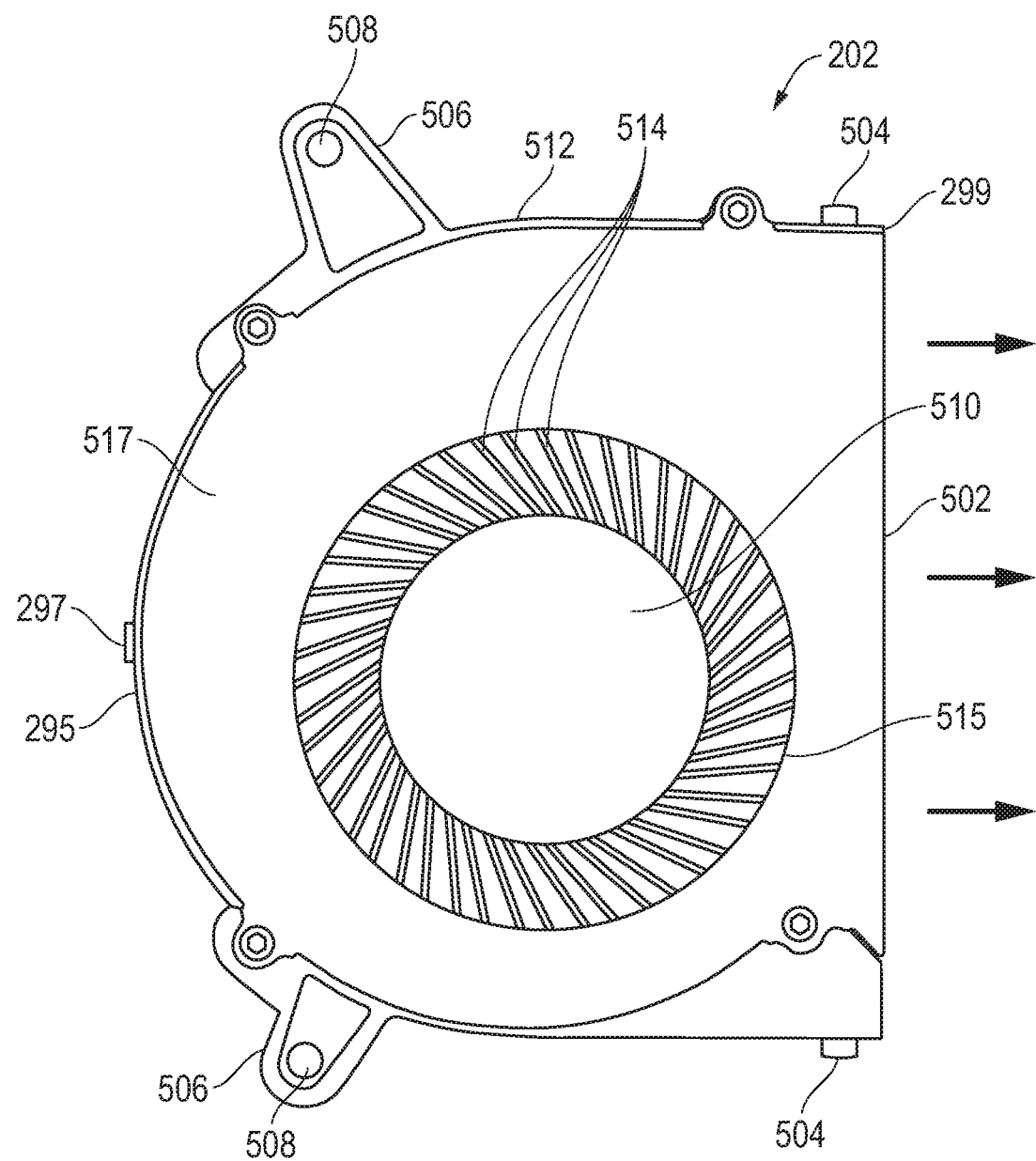
FIG. 6 illustrates a top view of a cooling fan blower according to one exemplary embodiment of the disclosed systems and methods.

FIG. 5 illustrates an overhead perspective view of cooling fan blower 204, and FIG. 6 illustrates an overhead view of the cooling fan blower 204 of FIG. 5. As shown in FIGS. 5 and 6, cooling fan blower 204 includes a rotating impeller 510 having fan blades 514 that are enclosed within a blower housing 512. Rotation of the impeller 510 draws cooing air through the cooling fan blower inlet 515 into the housing 512 at a right angle to the rotation of impeller 510, and exhausts this air through an outlet 502 on a proximal end 299 of the cooling fan blower housing 512 in the direction of the arrows shown in FIG. 6. As shown, cooling fan blower inlet 515 is defined in a rotor-side external surface 517 of cooling fan blower housing 512.

As shown in FIGS. 5 and 6, tool-less cooling fan mounting features are mechanically coupled to, or mechanically integrated with, cooling fan blower housing 512. As previously described, these tool-less cooling fan mounting features are configured to mate with the tool-less chassis mounting features of FIGS. 3 and 4 to mechanically align and secure cooling fan blower 202 to heat exchanger module 204 with its cooling air outlet 502 aligned in a fixed sealed position with the heat exchanger air inlet 320, i.e., to form an airflow path that extends from the cooling fan blower 202 in the direction of the arrows shown in FIG. 6 to the heat exchanger 321. The direction of this airflow path is oriented parallel to the X-axis when cooling fan blower 202 and heat exchanger 321 are fully assembled together.

Figure 8:
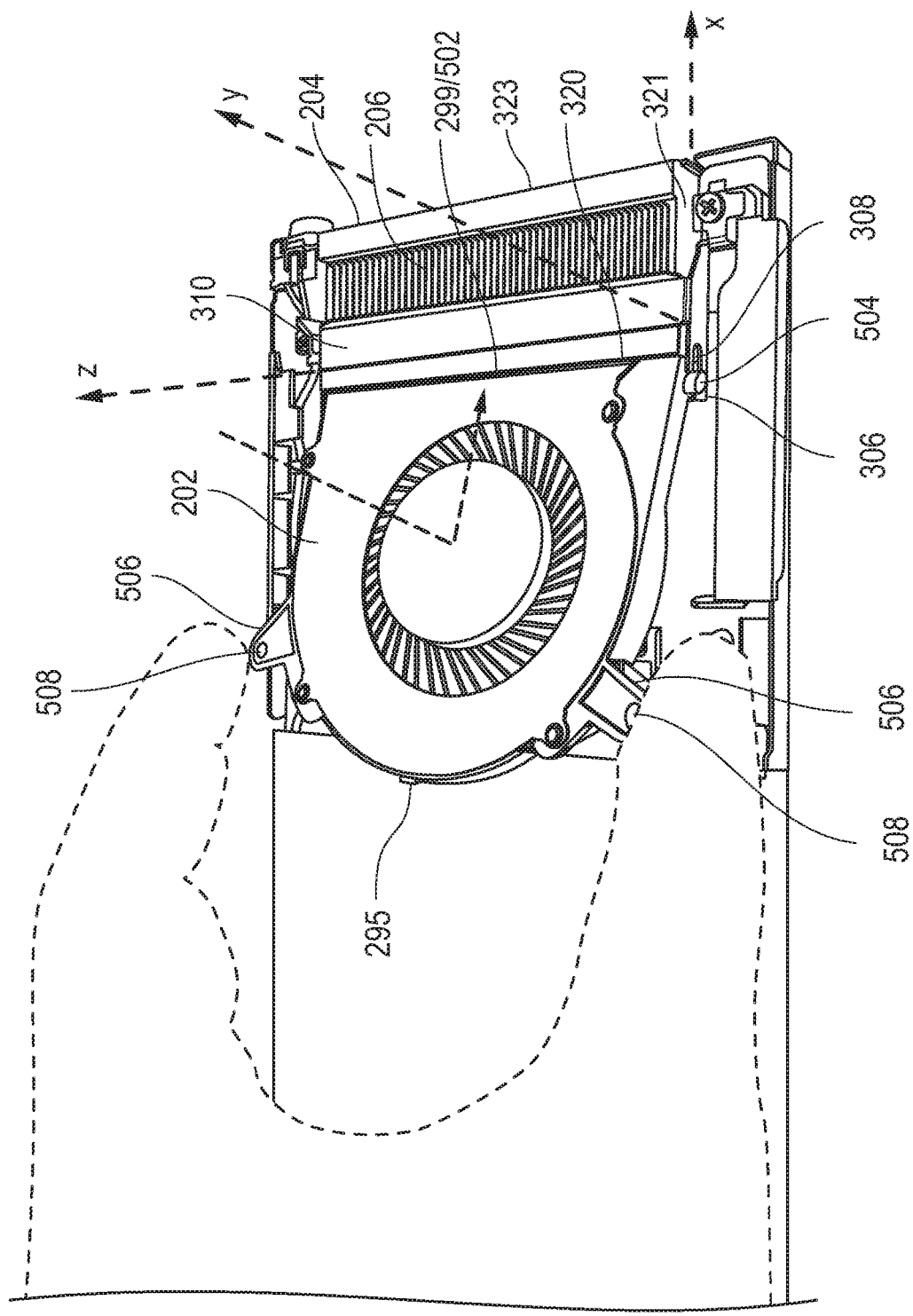
FIG. 8 illustrates a partial overhead side perspective view of a cooling fan blower and heat exchanger module according to one exemplary embodiment of the disclosed systems and methods.

The tool-less cooling fan mounting features of the embodiment of FIGS. 5 and 6 include two guide pins 504 that extend outwardly from opposing sides of cooling fan blower housing 512 in respective positions adjacent air outlet 502 that is provided on proximal end 299 of the cooling fan blower housing 512. Guide pins 504 are dimensioned and shaped to be received simultaneously within respective sliding rails 306 and their respective pin openings 308 of heat exchanger module 204 in a manner that sealingly aligns the X-axis and Y-axis of cooling fan blower housing 512 so that its air outlet 502 is aligned along the X-axis and Y-axis with the air inlet 320 of heat exchanger module 294 when proximal end 299 of cooling fan blower 202 is moved into engagement with heat exchanger air inlet 320 by the action of guide pins 504 sliding together within rails 306 to be simultaneously received in pin openings 308 as shown in FIG. 8 and FIG. 9.

The tool-less cooling fan mounting features of FIGS. 5 and 6 also include two spaced-apart alignment tabs 506 (e.g., plastic or metal tabs) extending outwardly from the periphery of cooling fan blower housing 512. Alignment tabs 506 include respective tab openings 508 (defined within respective alignment tabs 506) that are dimensioned, shaped and positioned to simultaneously receive respective extending alignment posts 304 extending from heat exchanger module 204 in a manner that aligns the Z-axis of cooling fan blower housing 512 so that its outlet 502 is sealingly aligned along the Z-axis with air inlet 320 of heat exchanger module 294 as shown in FIG. 9. Although in this embodiment two alignment tabs 506 with respective tab openings 508 extend outwardly from the periphery of cooling fan blower housing 512 in position to mate with two corresponding alignment posts 304 extending from base plate 350 of heat exchanger module 204 as shown, it will be understood that an alternative number and/or respective position/s of one or more alignment tab/s 506 and corresponding one or more alignment post/s 304 may be provided to achieve the Z-axis alignment described herein.

Figure 9:
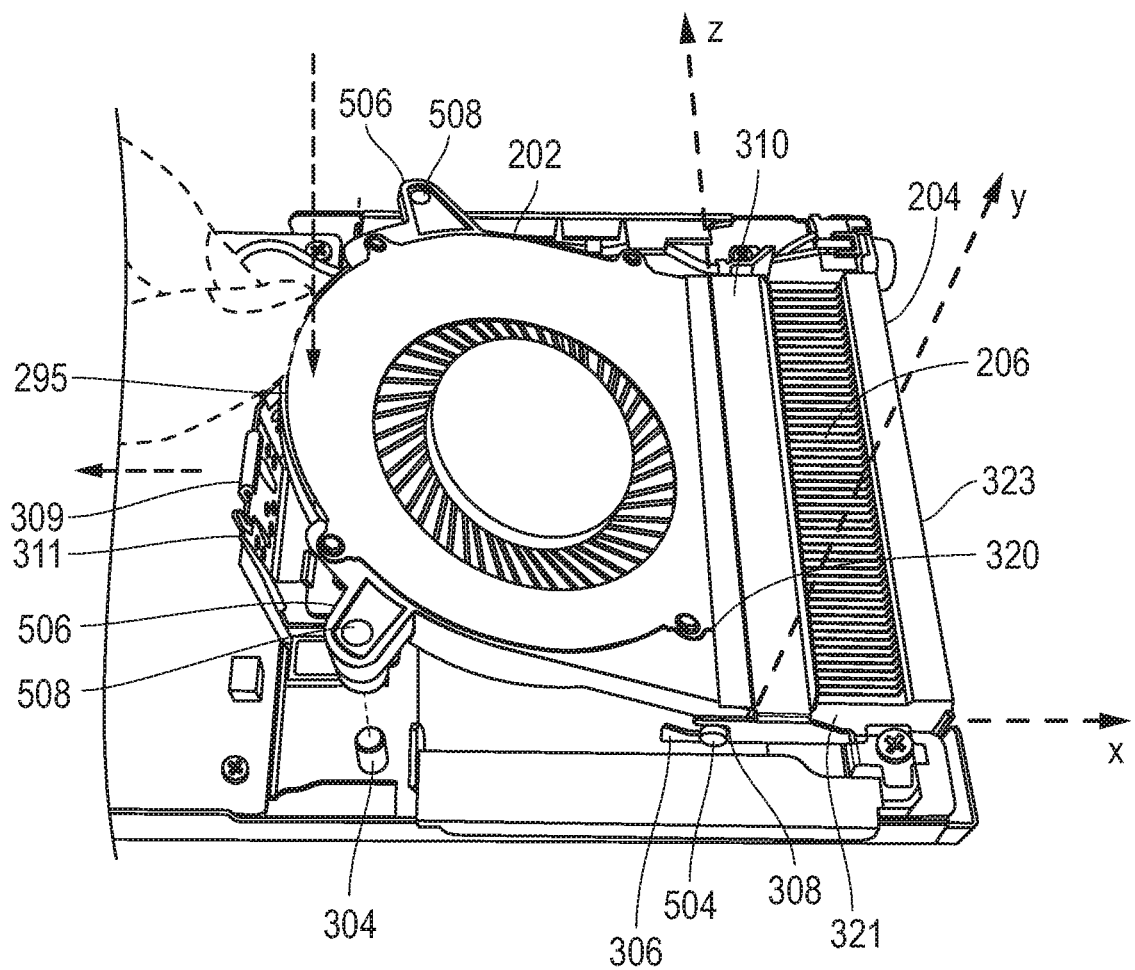
FIG. 9 illustrates a partial overhead side perspective view of a cooling fan blower and heat exchanger module according to one exemplary embodiment of the disclosed systems and methods.

As shown in FIG. 9, flexible resilient convex retainer 311 of heat exchanger module 204 is dimensioned to be deflected outward and away from cooling fan blower housing 512 in order to provide sufficient clearance to allow distal peripheral end 295 of the cooling fan blower housing 512 (i.e., opposite to proximal end 299 of housing 512) and its protruding retainer tab 297 to be moved together past inwardly protruding lip or hook 309 of retainer 311 into an engaged position with convex retainer 311. This insertion action may be accomplished by pivoting distal end 295 of cooling fan blower housing 512 toward base plate 350 about its guide pins 504 while they are received within pin openings 308 of heat exchanger module 204 to fix the X-axis position of the cooling fan blower housing 512 relative to heat exchanger module 204. As the distal end 295 of cooling fan blower housing 512 is so pivoted, the alignment posts 304 of heat exchanger module 204 are simultaneously inserted and received within respective tab openings 508 of cooling fan blower housing 512 to fix the Z-axis of the cooling fan blower housing 512 relative to heat exchanger module 204 as shown in FIG. 9.

Figure 10:
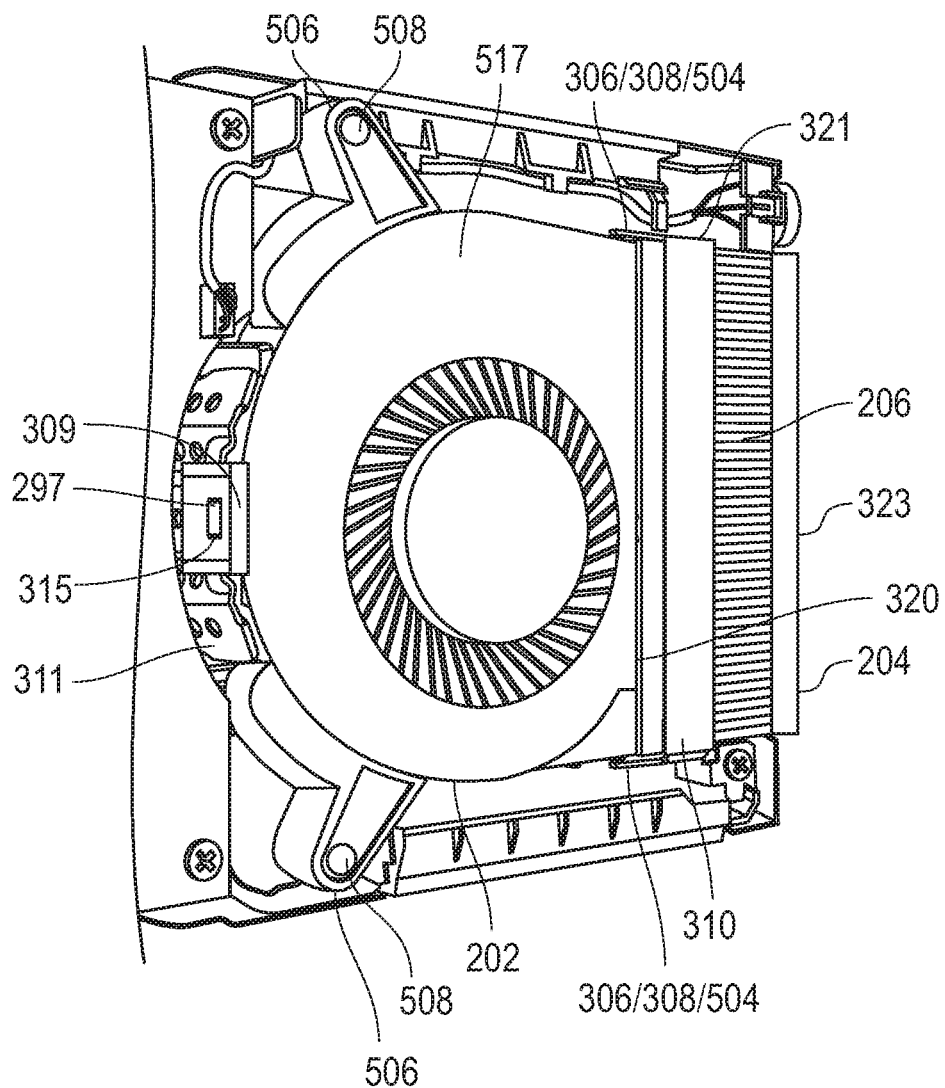
FIG. 10 illustrates a partial end perspective view of a cooling fan blower and heat exchanger module according to one exemplary embodiment of the disclosed systems and methods.

Referring to FIG. 10, distal end 295 of cooling fan blower housing 512 is pivoted further toward the base plate 350 of heat exchanger module 204 in order to align protruding retainer tab 297 of cooling fan blower housing 512 with complimentary shaped and dimensioned mating retainer opening 315, which is configured with dimensions and shape to securely receive protruding retainer tab 297 in inserted relationship. At this time, flexible resilient convex retainer 311 of heat exchanger module 204 may be relaxed and allowed to spring back toward cooling fan blower housing 512 so that retainer tab 297 of cooling fan blower housing 512 is inserted into and captured within retainer opening 315 to fix the Y-axis position of the cooling fan blower housing 512 relative to heat exchanger module 204. Also at this time, inwardly protruding lip or hook 309 of flexible resilient convex retainer 311 may be placed into overlapping contact with the surface of mated cooling fan blower housing 512, e.g., to provide additional mechanical contact to secure cooling fan blower housing 512 in fixed relationship to heat exchanger module 204 with its cooling air outlet 502 aligned in a fixed sealed position with the heat exchanger air inlet 320 as shown in FIG. 10. In the position of FIG. 10, no gap exists between the cooling fan blower cooling air outlet 502 and the heat exchanger air inlet 320 by virtue of the alignment of the X, Y and Z axes of cooling fan blower housing relative to heat exchanger module 204 that is achieved by the interaction of tool-less chassis mounting features and tool-less cooling fan mounting features as described above.

Figure 7:
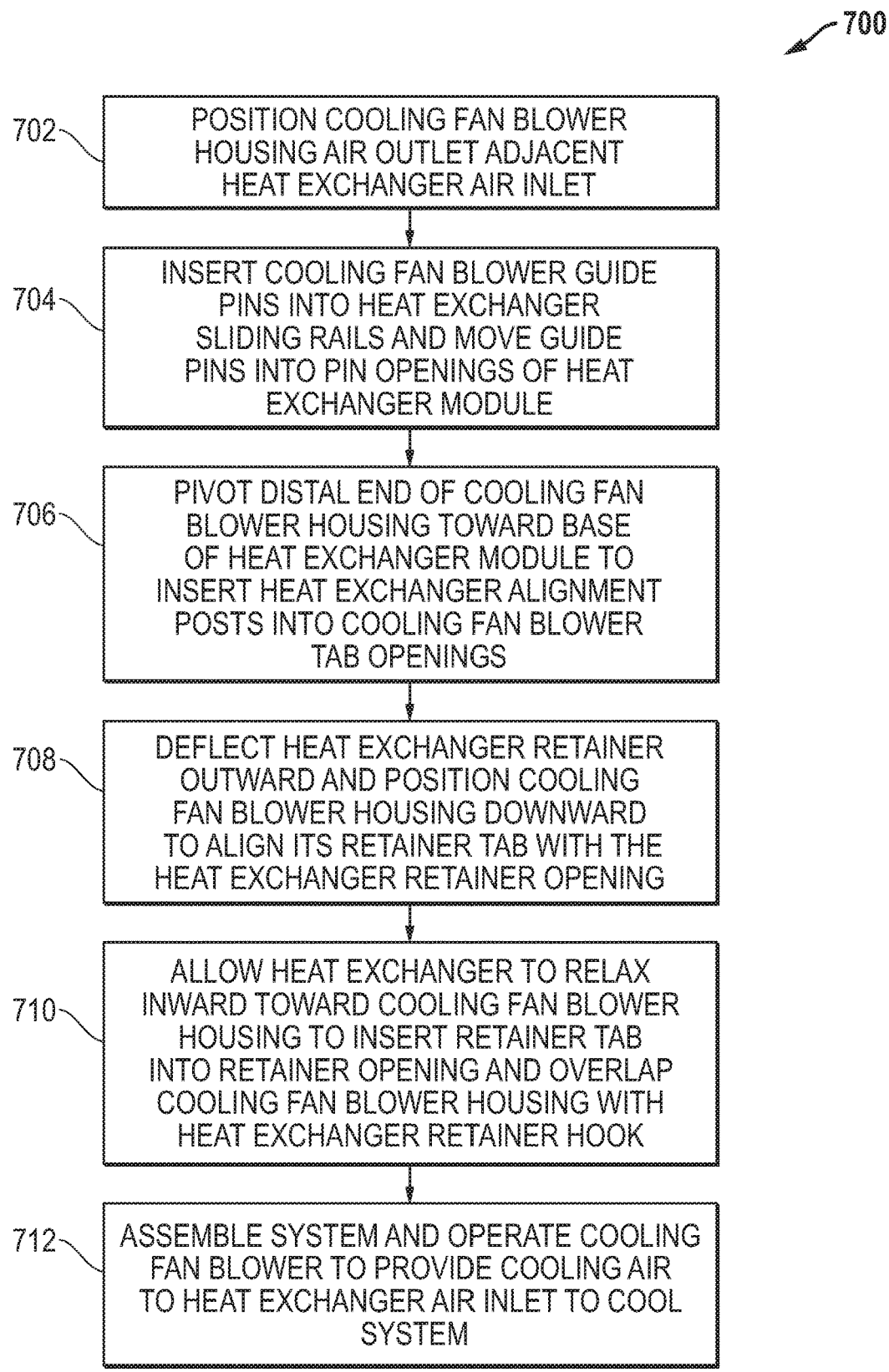
FIG. 7 illustrates methodology according to one exemplary embodiment of the disclosed systems and methods.

FIG. 7 illustrates one exemplary embodiment of a methodology 700 that may be employed to mechanically align and secure an air outlet of a cooling fan blower in sealing relationship with an air inlet of a heat exchanger within a chassis enclosure of an information handling system. Methodology 700 begins in step 702 where proximal end 299 of cooling fan blower housing 512 is brought into a position adjacent air inlet 320 of heat exchanger module 204, and in step 704 guide pins 504 of cooling fan blower housing 512 are simultaneously inserted within respective sliding rails 306 of heat exchanger module 204 and slid toward air inlet 320 of heat exchanger module 204 until guide pins 504 are both received in respective pin openings 308 of heat exchanger module 204, which provides a pivot axis therebetween for cooling fan blower housing 512 as shown in FIG. 8.

Next, in step 706, distal end 295 of cooling fan blower housing 512 is pivoted toward base plate 350 about its guide pins 504 to cause simultaneously insertion of heat exchanger module alignment posts 304 into respective tab openings 508 of cooling fan blower housing 512 to fix the Z-axis of the cooling fan blower housing 512 relative to heat exchanger module 204 as shown in FIG. 9.

Then, in step 708, flexible resilient convex retainer 311 of heat exchanger module 204 is deflected outward and away from cooling fan blower housing 512, and the distal peripheral end 295 of the cooling fan blower housing 512 moved to a position relative to base plate 350 of heat exchanger module 350 to align protruding retainer tab 297 with retainer opening 315 of flexible resilient convex retainer 311.

Figure 11:
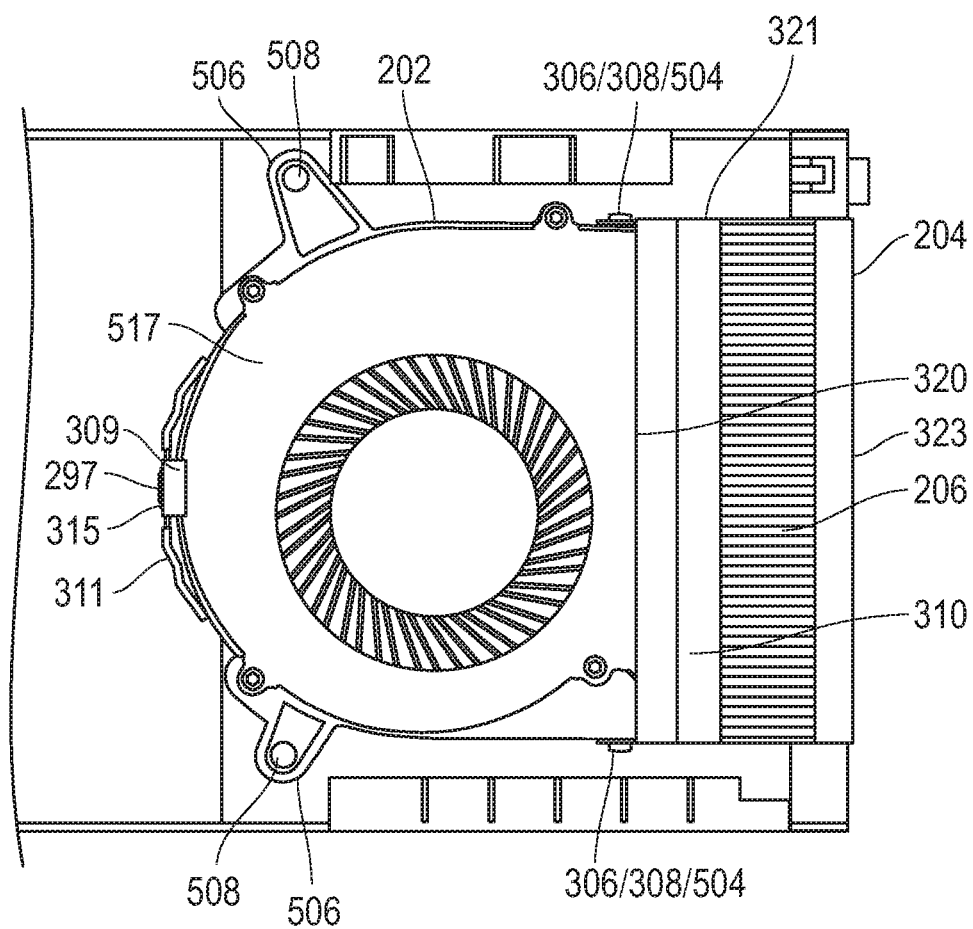
FIG. 11 illustrates a partial top view of a cooling fan blower and heat exchanger module according to one exemplary embodiment of the disclosed systems and methods.

Next, in step 710, flexible resilient convex retainer 311 of heat exchanger module 204 is allowed to relax toward cooling fan blower housing 512 so that retainer tab 297 of cooling fan blower housing 512 is inserted into and captured within retainer opening 315, and at the same time inwardly protruding lip or hook 309 of flexible resilient convex retainer 311 is allowed to move to a position overlapping rotor-side external surface 517 of cooling fan blower housing 512 to mechanically contact and contain rotor-side external surface 517 as shown in FIGS. 2, 10 and 11. At this time the information handling system 100 may be fully assembled with bottom surface installed on the underside of chassis enclosure 105, and then cooling fan blower 202 may be operated in step 712 to supply cooling air from cooing fan blower cooling air outlet 502 to heat exchanger module cooling air inlet 320 so as to circulate cooling air through chassis enclosure 105 as shown in FIG. 1.

It will be understood that the steps of methodology 700 are exemplary only, and that any other step order and/or combination of fewer, additional and/or alternative steps may be employed that is suitable for mechanically aligning and securing an air outlet of a cooling fan blower in gapless sealing relationship with an air inlet of a heat exchanger in a tool-less manner within a chassis enclosure of an information handling system.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed apparatus and methods may be utilized in various combinations and/or independently. Thus the invention is not limited to only those combinations shown herein, but rather may include other combinations.

What is claimed is:
1. An information handling system, comprising:
   a heat exchanger defining an air inlet having a cross-sectional air flow area;
   at least two rails disposed adjacent opposite sides of the air inlet of the heat exchanger, each of the rails having an upward facing elongated longitudinal rail surface that terminates in a rail opening, the elongated longitudinal rail surface extending longitudinally from a first end of the elongated longitudinal rail surface that is distal from the air inlet of the heat exchanger to an opposing second end of the elongated longitudinal rail surface that terminates in the rail opening at a position that is proximal to the air inlet of the heat exchanger, the rail opening having an open first side that is distal from the air inlet of the heat exchanger and the rail opening having an opposing closed second side that is proximal to the air inlet of the heat exchanger;
a retainer positioned in fixed spaced relationship opposite to the air inlet of the heat exchanger;
at least one post positioned in fixed spaced relationship to the air inlet of the heat exchanger; and
a cooling fan blower received in mating relationship with the heat exchanger, the cooling fan blower comprising a cooling fan blower housing defining an air outlet on a proximal end of the cooling fan blower housing, the air outlet being dimensioned with a cross-sectional air flow area that is complementary in shape and size to the cross-sectional air flow area of the air inlet of the heat exchanger, and the air outlet of the cooling fan blower being aligned and sealingly mated with the air inlet of the heat exchanger to form an airflow path between the cooling fan blower and the heat exchanger;
where the cooling fan blower further comprises:
two outward extending pins disposed adjacent opposite sides of the air outlet on the proximal end of the cooling fan blower, each of the pins being received against the closed second side of the respective rail opening of one of the rails with the air outlet of the cooling fan blower aligned and sealingly mated with the air inlet of the heat exchanger,
at least one post opening defined adjacent a periphery of the cooling fan blower, the post opening receiving the at least one post to align the position of the cooling fan blower air outlet relative to the heat exchanger with the air outlet of the cooling fan blower aligned and sealingly mated with the air inlet of the heat exchanger; and
where the retainer mechanically contacts the cooling fan blower housing with the air outlet of the cooling fan blower aligned and sealingly mated with the air inlet of the heat exchanger.

2. The information handling system of claim 1, where the air inlet of the heat exchanger has an elongated shape that extends between the opposite sides of the air inlet of the heat exchanger in a direction that is parallel to a first axis; where the airflow path between the cooling fan blower and the heat exchanger is oriented in a direction that is parallel to a second axis and that is perpendicular to the first axis, and where a longitudinal axis of the at least one post extends in a direction that is parallel to a third axis and that is perpendicular to each of the first axis and the second axis.

3. The information handling system of claim 2, where each of the pins of the cooling fan blower are received against the closed second side of a respective one of the rail openings to align the air outlet on the proximal end of the cooling fan blower with the air inlet of the heat exchanger in a direction parallel to the second axis and in a direction parallel to the third axis; where the at least one post is received within the at least one post opening to align a position of the cooling fan blower relative to the heat exchanger in a direction that is parallel to the first axis; and where the retainer mechanically contacts the cooling fan blower housing to align a position of a distal end of the cooling fan blower relative to the heat exchanger.

4. The information handling system of claim 1, further comprising two posts positioned in fixed spaced relationship to each other and to the air inlet of the heat exchanger; and where at least one post of the cooling fan blower comprises two spaced-apart post openings defined adjacent a periphery of the cooling fan blower, each of the two post openings receiving one of the two posts to align the position of the cooling fan blower air outlet with the air outlet of the cooling fan blower aligned and sealingly mated with the air inlet of the heat exchanger.

5. The information handling system of claim 1, where a distal end of the retainer inwardly protrudes to mechanically engage an upper surface of the cooling fan blower housing to fix the cooling fan blower in the mating relationship with heat exchanger.

6. The information handling system of claim 1, where an opening is defined in the retainer; where the cooling fan blower comprises a tab extending outwardly from the distal end of the cooling fan blower housing; and where the tab is received in mechanical engagement within the opening to fix the cooling fan blower in the mating relationship with heat exchanger.

7. The information handling system of claim 1, where the heat exchanger comprises cooling fins disposed within an enclosed cooling air path that is defined from the air inlet of the heat exchanger to an air outlet of the heat exchanger, the enclosed cooling air path directing air received at the heat exchanger air inlet from the air outlet of the cooling fan blower to and across the cooling fins to the air outlet of the heat exchanger.

8. The information handling system of claim 1, where the information handling system is a notebook computer.

9. A system, comprising an information handling system, the information handling system comprising:
a heat exchanger defining an air inlet having a cross-sectional air flow area;
at least two rails disposed adjacent opposite sides of the air inlet of the heat exchanger, each of the rails having an upward facing elongated longitudinal rail surface that terminates in a rail opening, the elongated longitudinal rail surface extending longitudinally from a first end of the elongated longitudinal rail surface that is distal from the air inlet of the heat exchanger to an opposing second end of the elongated longitudinal rail surface that terminates in the rail opening at a position that is proximal to the air inlet of the heat exchanger, the rail opening having an open first side that is distal from the air inlet of the heat exchanger and the rail opening having an opposing closed second side that is proximal to the air inlet of the heat exchanger;
a retainer positioned in fixed spaced relationship opposite to the air inlet of the heat exchanger; and
at least one post positioned in fixed relationship to the air inlet of the heat exchanger.

10. The information handling system of claim 1, where the retainer is flexible and resilient.

11. The system of claim 9, where the retainer is flexible and resilient.

12. The system of claim 9, further comprising a cooling fan blower, the cooling fan blower comprising:
a cooling fan blower housing defining an air outlet on a proximal end of the cooling fan blower housing, the air outlet being dimensioned with a cross-sectional air flow area that is complementary in shape and size to the cross-sectional air flow area of the air inlet of the heat exchanger;

two outward extending pins disposed adjacent opposite sides of the air outlet on the proximal end of the cooling fan blower, each of the pins being sized and spaced to be received against the closed second side of the respective rail opening of one of the rails when the air outlet of the cooling fan blower is aligned and sealingly mated with the air inlet of the heat exchanger, and at least one post opening defined adjacent a periphery of the cooling fan blower, the post opening being sized and positioned relative to the cooling fan blower housing to receive the at least one post to align the position of the cooling fan blower air outlet relative to the heat exchanger with the air outlet of the cooling fan blower aligned and sealingly mated with the air inlet of the heat exchanger; and where the retainer is spaced apart from the air inlet of the heat exchanger in a position to mechanically contact the cooling fan blower housing when the air outlet of the cooling fan blower is aligned and sealingly mated with the air inlet of the heat exchanger.

13. The system of claim 12, where the air inlet of the heat exchanger has an elongated shape that extends between the opposite sides of the air inlet of the heat exchanger in a direction that is parallel to a first axis; where the airflow path between the cooling fan blower and the heat exchanger is oriented in a direction that is parallel to a second axis and that is perpendicular to the first axis when the air outlet of the cooling fan blower is aligned and sealingly mated with the air inlet of the heat exchanger, where a longitudinal axis of the at least one post extends in a direction that is parallel to a third axis and that is perpendicular to each of the first axis and the second axis; where each of the pins of the cooling fan blower are sized and spaced to be received against the closed second side of a respective one of the rail openings to align the air outlet on the proximal end of the cooling fan blower with the air inlet of the heat exchanger in a direction parallel to the second axis and in a direction parallel to the third axis; where the at least one post is sized and positioned to be received within the at least one post opening to align a position of the cooling fan blower relative to the heat exchanger in a direction that is parallel to the first axis; and where the retainer is positioned to mechanically contact the cooling fan blower housing to align a position of a distal end of the cooling fan blower relative to the heat exchanger.

14. The system of claim 12, where a distal end of the retainer inwardly protrudes to a position that mechanically engages an upper surface of the cooling fan blower housing to fix the cooling fan blower in a mating relationship with the heat exchanger when the air outlet of the cooling fan blower is aligned and sealingly mated with the air inlet of the heat exchanger; where an opening is defined in the retainer and where the cooling fan blower further comprises a tab extending outwardly from the distal end of the cooling fan blower housing, the tab being sized and positioned to be received in mechanical engagement within the opening to fix the cooling fan blower in the mating relationship with heat exchanger.

15. The system of claim 12, where the heat exchanger comprises cooling fins disposed within an enclosed cooling air path that is defined from the air inlet of the heat exchanger to an air outlet of the heat exchanger, the enclosed cooling air path directing air received at the heat exchanger air inlet from the air outlet of the cooling fan blower to and across the cooling fins to the air outlet of the heat exchanger when the air outlet of the cooling fan blower is aligned and sealingly mated with the air inlet of the heat exchanger.

16. The system of claim 11, where the information handling system is a notebook computer.

17. A method, comprising positioning a cooling fan blower in mating relationship with a heat exchanger of an information handling system by aligning and sealingly mating an air outlet defined on a proximal end of a housing of the cooling fan blower with an air inlet of the heat exchanger to form an airflow path between the cooling fan blower and the heat exchanger, the method further comprising the steps of:

first positioning each of two outward extending pins of the cooling fan blower in contact with a respective upward facing elongated longitudinal rail surface of a respective one of two rails disposed adjacent opposite sides of the air inlet of the heat exchanger, the respective elongated longitudinal rail surface of each respective rail extending longitudinally from a first end of the respective elongated longitudinal rail surface that is distal from the air inlet of the heat exchanger to an opposing second end of the respective elongated longitudinal rail surface and terminating in the respective rail opening of the respective rail at a position that is proximal to the air inlet of the heat exchanger, the closed second side of the respective rail opening of each respective rail being proximal to the air inlet of the heat exchanger, and the respective rail opening of each respective rail having an open first side that is distal from the air inlet of the heat exchanger and that opposes the closed second side of the respective rail opening, and the outward extending pins being disposed adjacent opposite sides of the air outlet on the proximal end of the cooling fan blower;

then moving the cooling fan blower toward the air inlet of the heat exchanger with each of the two outward extending pins of the cooling fan blower in contact with the respective upward facing elongated longitudinal rail surface of the respective one of the two rails to cause each of the two outward extending pins of the cooling fan blower to slide on the respective upward facing elongated longitudinal rail surface of the respective one of the two rails toward the respective second end of the respective elongated longitudinal rail surface until each of the two outward extending pins is disposed against the closed second side of the respective rail opening of the respective one of the two rails disposed adjacent opposite sides of the air inlet of the heat exchanger;

then positioning at least one post opening defined adjacent a periphery of the cooling fan blower in aligned position over at least one post extending in fixed spaced relationship to the air inlet of the heat exchanger while positioning a distal end of the cooling fan blower over a retainer that extends upward in fixed spaced relationship opposite to the air inlet of the heat exchanger;

then pivoting the distal end of the cooling fan blower toward the retainer to insert the at least one post into the at least one post opening to align the position of the cooling fan blower air outlet relative to the heat exchanger with the air outlet of the cooling fan blower aligned and sealingly mated with the air inlet of the heat exchanger; and deflecting the retainer away from the heat exchanger air inlet while pivoting the distal end of the cooling fan blower to provide clearance for the distal end of the cooling fan blower to bring the distal end of the cooling fan blower adjacent the retainer, and then allowing the retainer to relax back toward the heat exchanger air inlet to mechanically contact and engage the cooling fan blower housing to hold each of the two outward extending pins disposed against the closed second side of the respective rail opening of the respective one of the two rails with the air outlet of the cooling fan blower aligned and sealingly mated with the air inlet of the heat exchanger.

18. The method of claim 17, where the air inlet of the heat exchanger has an elongated shape that extends between the opposite sides of the air inlet of the heat exchanger in a direction that is parallel to a first axis; where the airflow path between the cooling fan blower and the heat exchanger is oriented in a direction that is parallel to a second axis and that is perpendicular to the first axis when the air outlet of the cooling fan blower is aligned and sealingly mated with the air inlet of the heat exchanger, where a longitudinal axis of the at least one post extends in a direction that is parallel to a third axis and that is perpendicular to each of the first axis and the second axis; where each of the pins of the cooling fan blower are sized and spaced to be received against the respective closed second side of a respective one of the rail openings to align the air outlet on the proximal end of the cooling fan blower with the air inlet of the heat exchanger in a direction parallel to the second axis and in a direction parallel to the third axis; where the at least one post is sized and positioned to be received within the at least one post opening to align a position of the cooling fan blower relative to the heat exchanger in a direction that is parallel to the first axis; and where the retainer is positioned to mechanically contact the cooling fan blower housing to align a position of a distal end of the cooling fan blower relative to the heat exchanger.

19. The method of claim 17, where a distal end of the retainer inwardly protrudes to a position that mechanically engages an upper surface of the cooling fan blower housing to fix the cooling fan blower in a mating relationship with the heat exchanger when the air outlet of the cooling fan blower is aligned and sealingly mated with the air inlet of the heat exchanger; where an opening is defined in the retainer and where the cooling fan blower further comprises a tab extending outwardly from the distal end of the cooling fan blower housing, the tab being received in mechanical engagement within the retainer opening to fix the cooling fan blower in the mating relationship with heat exchanger when the retainer mechanically contacts and engages the distal end of the cooling fan blower with the air outlet of the cooling fan blower being aligned and sealingly mated with the air inlet of the heat exchanger.

20. The method of claim 17, where the step of then positioning at least one post opening further comprises then positioning each of two post openings defined adjacent a periphery of the cooling fan blower in aligned positions over a respective post extending in fixed spaced relationship to the air inlet of the heat exchanger while positioning the distal end of the cooling fan blower over the retainer.

21. The method of claim 17, where the heat exchanger comprises cooling fins disposed within an enclosed cooling air path that is defined from the air inlet of the heat exchanger to an air outlet of the heat exchanger; and where the method further comprises operating the cooling fan blower to provide cooling air from the air outlet of the cooling fan blower to the air inlet of the heat exchanger, the enclosed cooling air path directing air received at the heat exchanger air inlet from the air outlet of the cooling fan blower to and across the cooling fins to the air outlet of the heat exchanger when the air outlet of the cooling fan blower is aligned and sealingly mated with the air inlet of the heat exchanger.

22. The method of claim 17, where the information handling system is a notebook computer.

23. The method of claim 17, where the retainer is flexible and resilient.

* * * * *